(12) United States Patent
Stickle

(10) Patent No.: US 6,680,679 B2
(45) Date of Patent: Jan. 20, 2004

(54) METHOD AND APPARATUS FOR ELECTRICAL CONVERSION OF NON-RETURN TO ZERO ENCODED SIGNAL TO RETURN TO ZERO ENCODED SIGNAL

(75) Inventor: Kyle Stickle, Campbell, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 10/087,542

(22) Filed: Mar. 1, 2002

(65) Prior Publication Data

US 2003/0164782 A1 Sep. 4, 2003

(51) Int. Cl.[7] ............................. H03M 7/12; G02F 1/01; G11B 33/14
(52) U.S. Cl. ............................. 341/69; 341/68; 341/143; 385/1; 360/67; 360/255; 360/97.02; 360/77.04
(58) Field of Search .................. 359/181, 187, 359/158, 124; 385/1; 341/69, 68, 143; 360/67, 255, 97.02, 77.04

(56) References Cited

U.S. PATENT DOCUMENTS

| | | | |
|---|---|---|---|
| 4,775,900 A | * 10/1988 | Blessinger | 341/69 |
| 5,248,969 A | 9/1993 | Lee et al. | 341/73 |
| 5,339,185 A | * 8/1994 | Kaede | 341/68 |
| 5,528,237 A | * 6/1996 | Moloney et al. | 341/68 |
| 5,625,722 A | * 4/1997 | Froberg et al. | 341/69 |
| 5,689,530 A | * 11/1997 | Honaker, Jr. | 341/68 |
| 5,694,267 A | * 12/1997 | Morehouse et al. | 360/97.02 |
| 5,748,123 A | * 5/1998 | Lee | 341/68 |
| 5,760,986 A | * 6/1998 | Morehouse et al. | 360/67 |
| 5,781,076 A | 7/1998 | Iwamatsu | 332/103 |
| 5,835,303 A | * 11/1998 | Morehouse et al. | 360/97.01 |
| 5,867,340 A | * 2/1999 | Morehouse et al. | 360/77.04 |
| 6,097,529 A | 8/2000 | Lee | 359/279 |
| 6,118,564 A | 9/2000 | Ooi | 359/139 |
| 6,118,566 A | 9/2000 | Price | 359/181 |
| 6,201,621 B1 | 3/2001 | Desurvire | 359/158 |
| 6,204,789 B1 | 3/2001 | Nagata | 341/144 |
| 6,226,090 B1 | 5/2001 | Yoneyama | 356/450 |
| 6,246,348 B1 | 6/2001 | Moscatelli | 341/68 |
| 6,310,747 B1 | * 10/2001 | Emo et al. | 360/97.02 |
| 6,466,143 B2 | * 10/2002 | Eshraghi et al. | 341/68 |

* cited by examiner

Primary Examiner—Michael Tokar
Assistant Examiner—Lam T. Mai
(74) Attorney, Agent, or Firm—Fliesler Dubb Meyer & Lovejoy LLP

(57) ABSTRACT

A method and apparatus for electrically converting a NRZ signal into a RZ signal. A NRZ signal is summed with a phase-aligned clock signal. The resultant summed signal is then passed through a biased PHEMT transistor which has highly non-linear characteristics. The transistor is biased such that portions of the summed signal below a predetermined level are clipped resulting in an inverted RZ format signal equivalent to the received NRZ signal.

19 Claims, 4 Drawing Sheets

METHOD AND APPARATUS FOR ELECTRICAL CONVERSION OF NON-RETURN TO ZERO ENCODED SIGNAL TO RETURN TO ZERO ENCODED SIGNAL

FIELD OF THE INVENTION

The present invention is related to coded data generation or conversion and, more particularly to a method and apparatus for converting a non-return to zero (NRZ) signal to a return to zero (RZ) signal.

BACKGROUND OF THE INVENTION

Modem optical data communication networks often require that data transmitted through the optical communication network be encoded in a return-to-zero (RZ) format. Since a majority of digital electronic data is encoded using a non-return-to-zero (NRZ) format, the digital electronic signals must be converted from NRZ format to RZ format to be transmitted within an optical communication network.

Existing high speed RZ optical network transmitters use various methods of converting NRZ encoded data received from a multiplexer into RZ encoded data before it is sent over an optical fiber. The most common method uses two optical amplitude modulators. The first optical modulator is driven by a clock signal and produces a stream of RZ "ones." The second optical modulator is driven by NRZ data. The second optical modulator gates the stream of RZ "ones" to produce RZ data. Although simple, the multiple optical modulators make this technique of generating RZ data expensive.

U.S. Pat. No. 5,625,722, entitled "METHOD AND APPARATUS FOR GENERATING DATA ENCODED PULSES IN RETURN-TO-ZERO FORMAT," discloses an alternate method of generating RZ signals for transmission in an optical network. A laser is used to generate a continuous light stream which is the first input of a modulator. The NRZ signal gates the continuous light stream by allowing the light stream to output an optical signal only when the NRZ signal transitions from predetermined levels. This method of signal conversion is also more expensive than electrical conversion of the NRZ signal to a RZ format. U.S. Pat. No. 5,625,722 is hereby incorporated by reference into the specification of the present invention.

A third known method of electrical NRZ-to-RZ conversion uses high-speed digital logic integrated circuits (ICs). A NAND gate that has NRZ data and a clock signal as it two inputs will produce inverted RZ data as its output. These ICs, although much cheaper than optical modulators, are also expensive.

What is needed is an efficient and cost effective method and apparatus for electrically converting a NRZ signal into a RZ signal.

SUMMARY OF THE INVENTION

The present invention is intended to provide a low cost method and apparatus for converting a NRZ signal with a synchronous clock signal to a RZ signal.

In one embodiment, an incoming clock signal is phase aligned to an incoming NRZ signal. The NRZ signal and the clock signal are then summed to produce a combined signal. The combined signal is then passed across a Pseudomorphic High Electron Mobility Transistor (PHEMT). The PHEMT is biased near pinchoff such that only those portions of the clock signal that were combined with the digital "ones" of the NRZ signal cause an output signal on the PHEMT. Portions of the clock signal that were combined with the digital "zeroes" of the NRZ signal are clipped. The resultant signal is an inverted RZ signal.

DETAILED DESCRIPTION

Figure 1A:
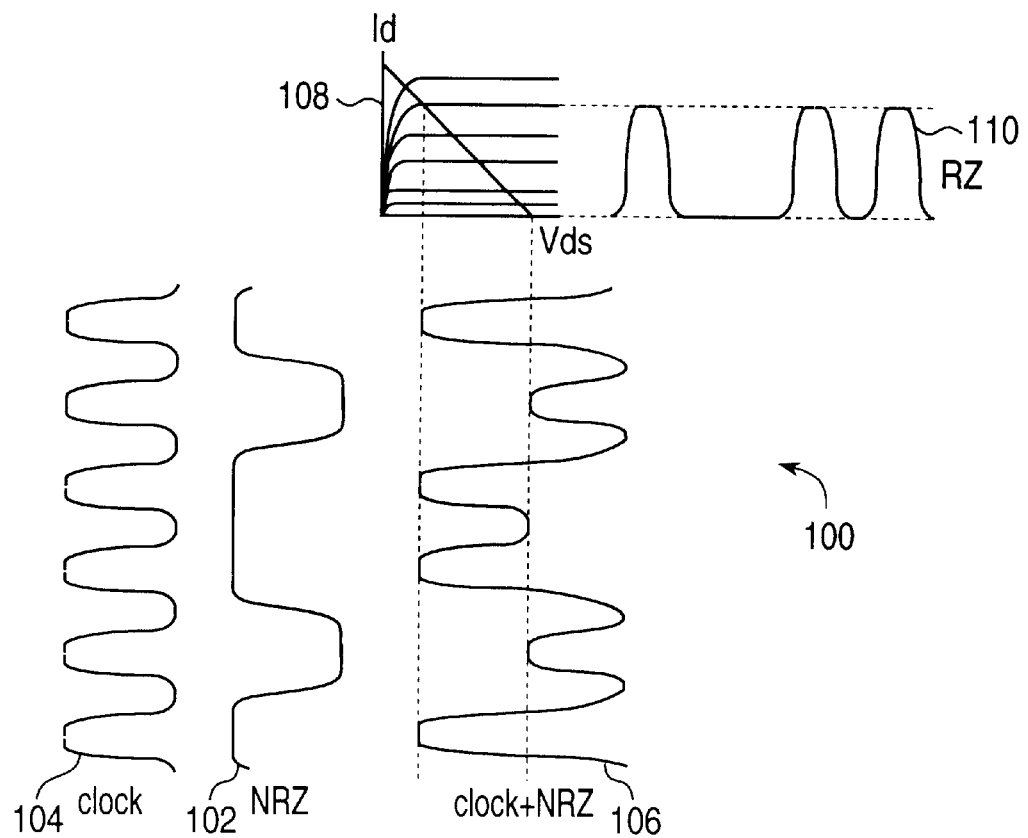
FIG. 1a is a graphical representation of the NRZ to RZ conversion process.

FIG. 1a is a graphical representation of the conversion of an incoming NRZ signal into a RZ signal. A received NRZ signal 102 is summed with a phase aligned clock signal 104 to produce a summed signal 106. The summed signal 106 is then clipped according to the V-I diagram 108. The V-I diagram 108 graphically represents the response characteristics of a specified transistor (not shown). The output signal 110 is the result of the nonlinear amplification of the summed signal according to the V-I diagram 108. The output signal 110 is an inverted RZ version of the original NRZ signal 102.

Figure 1B:
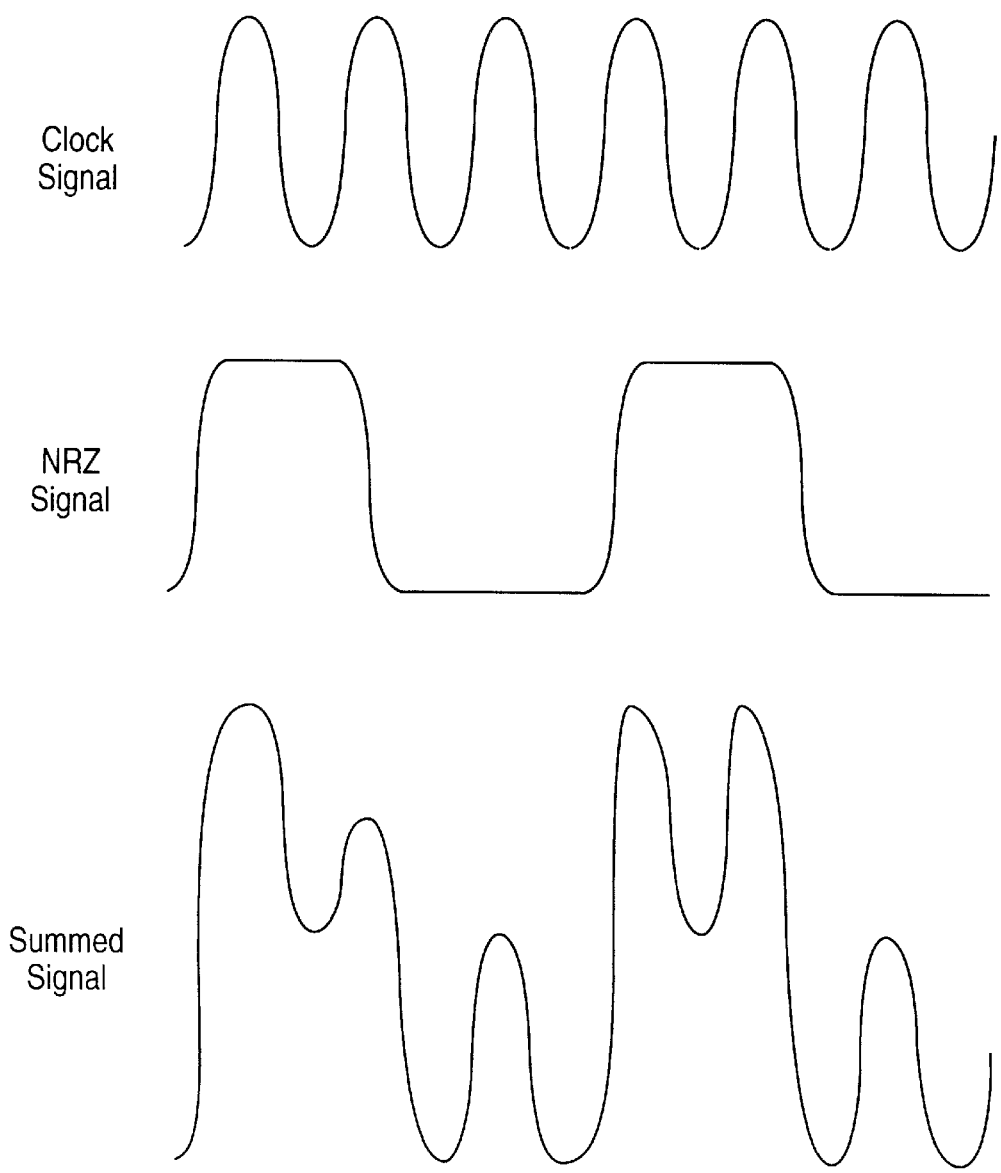
FIG. 1b is a graphical representation of a summation of a NRZ signal with a non-phase matched clock signal.

Phase aligning the clock signal 104 to the received NRZ signal 102 is performed to generate a cleaner summed signal 106 and output signal 110. As shown in FIG. 1b, if the clock signal 104 is not accurately phase aligned to the NRZ signal 102, the resultant summed signal will contain peaks of unequal amplitudes 112. This will generate a false RZ signal when passed to the gate of the transistor.

Figure 2:
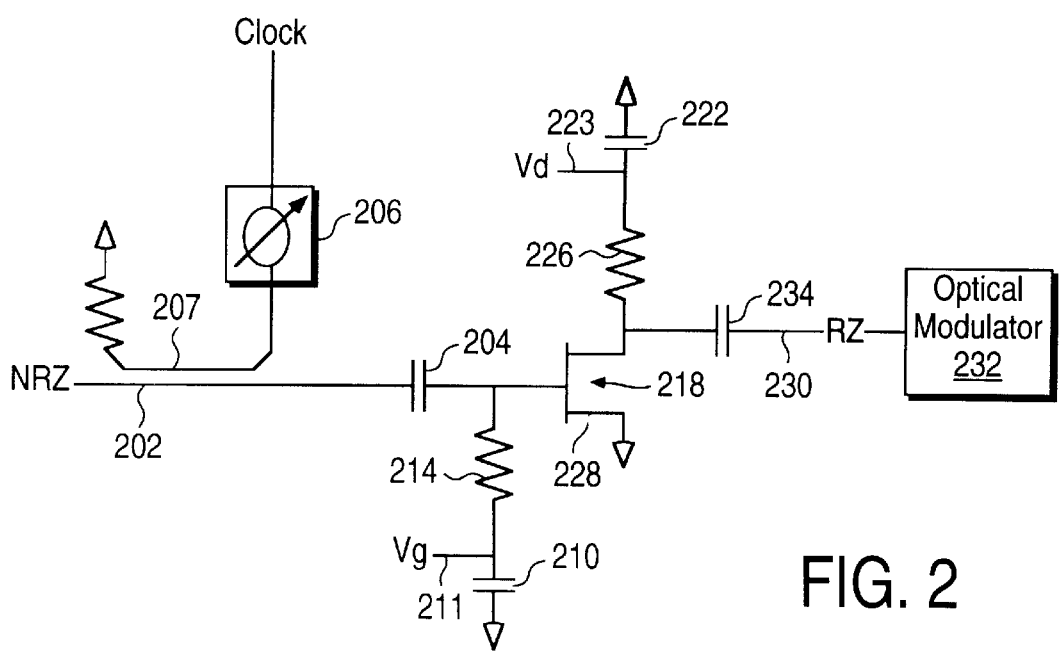
FIG. 2 depicts a circuit diagram of a NRZ to RZ conversion apparatus.

FIG. 2 depicts an embodiment of a schematic circuit diagram 200 of an apparatus for electrically converting a NRZ sign into an inverted RZ signal as represented in FIG. 1a, but without the misalignment of FIG. 1b. The device includes an input signal line 202 for receiving a NRZ signal. The input signal line 202 is connected to a broadband DC blocking capacitor 204. Although the capacitor 204 is shown, a direct connection without the capacitor 204 may be alternatively used.

The clock signal is input into a signal phase shifter 206 which is controlled to phase align the clock signal with a phase of the incoming NRZ signal, such that the peaks of clock signal are centered within the NRZ signal bits. The clock signal is coupled to the line 202 using a coupler 207. In an alternate embodiment, the phase-matched clock signal may be directly combined with the input signal through a power combiner (not shown). A gate voltage source 211 is applied to the gate 212 of a transistor 218 through a resistor 214 that is AC coupled to ground via a broadband bypass capacitor 210. In one embodiment, the resistor 214 is a 50 Ohm resistor, which provides a good 50 Ohm input match. However, the resistance of the resistor 214 value may be altered depending on design requirements.

The NRZ signal is thus effectively added to the combined signal to generate a summed signal on a gate of transistor 218. In one embodiment, the transistor 218 is a Pseudomorphic High Electron Mobility Transistor (PHEMT), since a PHEMT exhibits highly non-linear behavior when biased near the pinchoff voltage. However, any transistor, when appropriately biased which exhibits highly non-linear behavior may be used.

A drain voltage source 223 is applied to the transistor 218 through a resistor 226 that is AC coupled to ground through a broadband bypass capacitor 222. The transistor 218 operates on the combined signal. The resistor 226 has a value selected to provide an appropriate output match for the transistor 218.

The source 228 of the transistor 218 is grounded. An output line 230 of the circuit is connected to the drain of the transistor 218. In one embodiment, the output line 230 has a Broadband DC blocking capacitor 230. The output line is connected to an optical modulator 232 capable of generating an optical signal from the output signal.

In operation, a NRZ signal is summed with a phase-aligned clock signal. The resultant summed signal is applied to the gate of the transistor 218. Portions of the summed signal having a voltage less than a predetermined pinchoff are clipped and portions of the signal having a voltage at or above the predetermined pinchoff level are amplified according to the V-I characteristics of the transistor. The resultant output signal from the transistor is an inverted RZ signal generated from the received NRZ signal and clock signal.

Figure 3:
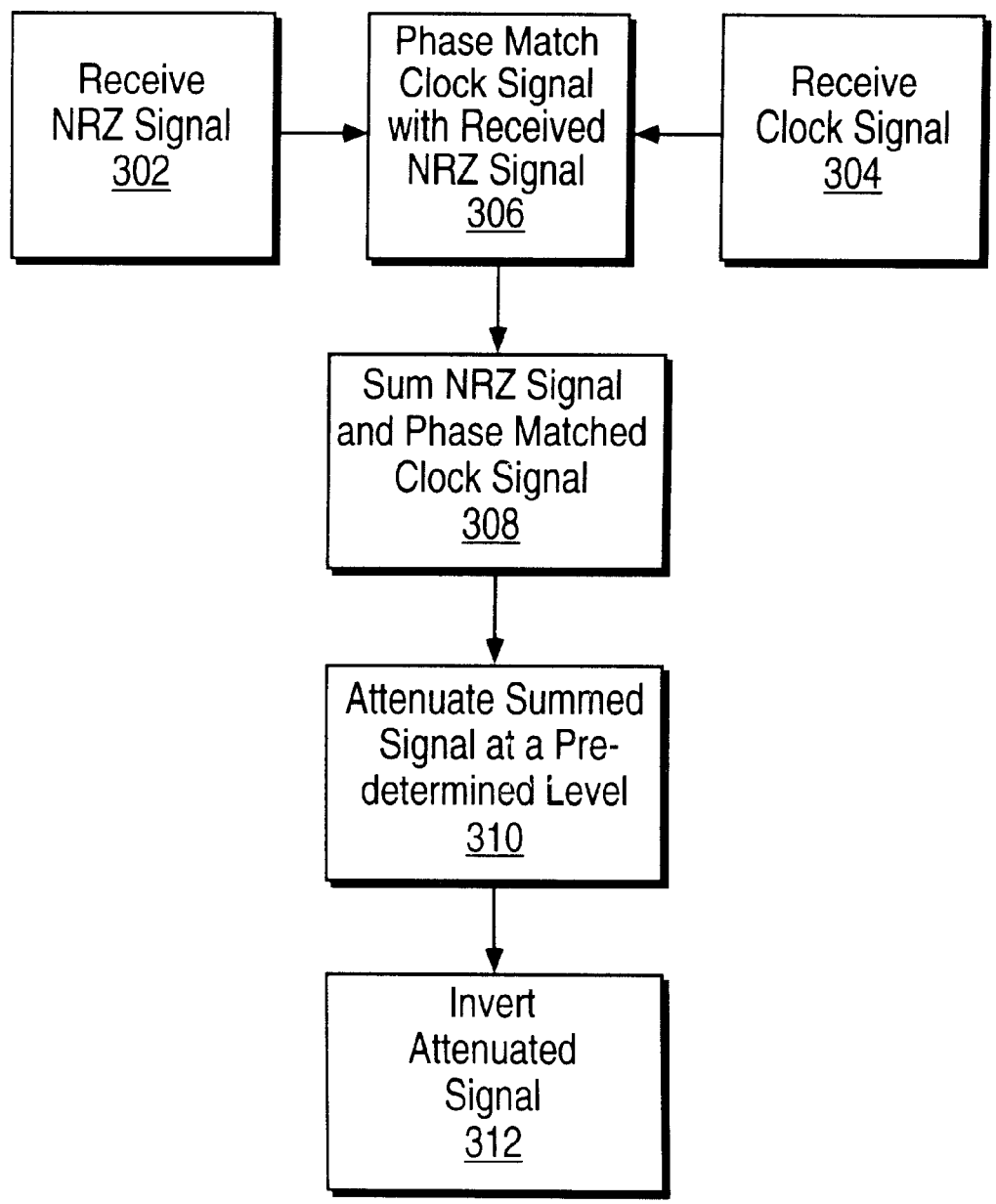
FIG. 3 depicts method steps showing the NRZ to RZ conversion process.

FIG. 3 is a flow diagram showing the method steps used by the circuit of FIG. 2 for converting a NRZ signal to a RZ signal. First in step 302, a NRZ signal is received. In step 304, a clock signal is received. The clock signal is then phase aligned to the NRZ signal in step 306. In the embodiment of FIG. 2, a phase shifter is used to phase align the clock signal. The received NRZ signal and the phase aligned clock signal are then bitwise summed in step 308 to generate a summed signal. The bitwise summation may be performed by any technique known in the art which will provide a summed signal having sufficient signal definition. The summed signal is then clipped at a predetermined level in step 310 such that any portion of the signal with a signal level below the predetermined level is attenuated to zero. Portions of the signal with a signal strength above the predetermined level are amplified according to the V-I characteristics of the device. In the embodiment of FIG. 2, the summed signal is passed through a PHEMT to accomplish the nonlinear amplification of the summed signal. The output signal is an inverted RZ signal of the received NRZ signal. The signal is inverted in step 314 to produce a noninverted RZ signal.

Although the invention has been described above with particularity, this was merely to teach one of ordinary skill in the art how to make and use the invention. Many modifications will fall within the scope of the invention, as that scope is defined by the following claims.

What is claimed is:

1. A method of converting a NRZ signal to a RZ signal comprising the steps of:
   receiving a NRZ signal;
   receiving a clock signal;
   combining said NRZ signal and said clock signal, thereby creating a combined signal; and
   clipping portions of said combined signal having a signal strength less than a predetermined level.

2. The method of converting a NRZ signal to a RZ signal of claim 1 further comprising the step of varying the phase of said clock signal to match a phase of said NRZ signal.

3. The method of converting a NRZ signal to a RZ signal of claim 1 wherein said step of combining said NRZ signal and said clock signal comprises the step of superimposing said clock signal and said NRZ signal.

4. An electrical signal conversion apparatus comprising:
   a signal combiner having a first input, a second input and an output a clock signal input line, said clock signal input line coupled to said first input of said signal combiner;
   an input data line, said input data line coupled to said second input of said signal combiner; and
   a transistor having an input and an output, said output of said signal combiner coupled to said input of said transistor, said transistor having a predetermined pinchoff voltage such that only signals having a voltage greater that said pinchoff voltage cause a signal to be transmitted to said output of said transistor.

5. The electrical signal conversion apparatus of claim 4 wherein said signal combiner is a directional coupler.

6. The electrical signal conversion apparatus of claim 4 wherein said signal combiner is a power combiner.

7. The electrical signal conversion apparatus of claim 4 wherein said transistor is a PHEMT active device.

8. The electrical signal conversion apparatus of claim 4 wherein said predetermined pinchoff voltage corresponds to an average peak strength of a timing signal generated by said clock signal generator.

9. The electrical signal conversion apparatus of claim 4 wherein said phase of said clocking signal varies such that peak of said clock signal corresponds to a bit center of an NRZ input signal on said second input of said signal combiner.

10. A method of converting a NRZ signal to a RZ signal comprising the steps of:
    receiving a NRZ signal;
    determining a phase of said NRZ signal;
    generating a clock signal having a phase matching said phase of said NRZ signal;
    summing said clock signal and said NRZ signal to generate a summed signal;
    clipping said summed signal.

11. The method of converting a NRZ signal to a RZ signal of claim 10 further comprising the step of:
    inverting said clipped summed signal.

12. The method of converting a NRZ signal to a RZ signal of claim 10 wherein said step of clipping said summed signal includes the step of clipping portions of said summed signal having a signal strength less than a predetermined level.

13. The method of converting a NRZ signal to a RZ signal for claim 10 wherein said step of clipping said summed signal further comprises the step of modifying said predetermined level.

14. An apparatus for electrically converting a NRZ signal to a RZ signal and generating an optical RZ signal comprising:
    a signal combiner having a first input and a second input;
    a clock signal line, said clock signal line coupled to said first input of said signal combiner;
    an input data line, said input data line coupled to said second input of said signal combiner;
    a transistor having a gate, a source and a drain, said drain being coupled to an output, said output of said signal combiner being coupled to said gate of said transistor, said transistor having a predetermined pinchoff voltage such that only signals applied to said gate of said transistor having a signal strength greater that said predetermined pinchoff voltage cause a signal to be transmitted from said drain to said output; and
    an optical modulator coupled to said output of said transistor.

15. The apparatus for electrically converting a NRZ signal to a RZ signal and generating an optical RZ signal of claim 14, wherein said signal combiner a directional coupler.

16. The apparatus for electrically converting a NRZ signal to a RZ signal and generating an optical RZ signal of claim 14, wherein said signal combiner is a power combiner.

17. The apparatus for electrically converting a NRZ signal to a RZ signal and generating an optical RZ signal of claim 14, wherein said transistor is a PHEMT active device.

18. The apparatus for electrically converting a NRZ signal to a RZ signal and generating an optical RZ signal of claim 14, wherein said phase of said clocking signal varies such that a peak of said clock signal corresponds to bit center of an input NRZ signal on said second input of said signal combiner.

19. An apparatus for electrically converting a NRZ signal to a RZ signal and generating an optical RZ signal comprising:

an input line adapted to receive an NRZ input signal;

a phase shifter connected to a clock input signal; said phase shifter adapted to alter a generated clock signal to match a phase of said input signal;

a signal coupler connected to said phase shifter adapted to couple said phase-aligned clock signal with said input signal on said input line, said signal coupler being located between said phase shifter and said first terminating resistor;

a first capacitor connected to said input line to filter said coupled signal;

a gate input line connected to said input line; said gate input line including a second resistor and a second capacitor in series and having a gate voltage source connected between said second resistor and said second capacitor;

a PHEMT having a gate, a drain and a source, said gate of said PHEMT connected to said input line, said source being grounded; said drain including a third resistor and a third capacitor connected in series and having a drain voltage source connected between said third resistor and said third capacitor;

an output line connected to said drain between said PHEMT and said third resistor, said output line including a fourth capacitor; and an optical modulator connected to said output line.

* * * * *